(12) United States Patent
Kim

(10) Patent No.: US 6,661,218 B2
(45) Date of Patent: Dec. 9, 2003

(54) HIGH VOLTAGE DETECTOR

(75) Inventor: Yong-Ki Kim, Kyoungki-do (KR)

(73) Assignee: Hynix Semiconductor Inc, Kyoungki-do (KR)

( * ) Notice: Subject to any disclaimer, the term of this patent is extended or adjusted under 35 U.S.C. 154(b) by 3 days.

(21) Appl. No.: 10/034,892

(22) Filed: Dec. 28, 2001

(65) Prior Publication Data
US 2002/0105318 A1 Aug. 8, 2002

(30) Foreign Application Priority Data
Dec. 30, 2000 (KR) .......................... 2000-87590

(51) Int. Cl.[7] .............................. G01R 7/04; G11C 7/02
(52) U.S. Cl. ..................................... 324/158.1; 365/207
(58) Field of Search .............................. 324/158.1, 765; 327/78, 89, 143; 365/205, 207, 208

(56) References Cited

U.S. PATENT DOCUMENTS

| | | | | |
|---|---|---|---|---|
| 4,716,307 A | * | 12/1987 | Aoyama ..................... | 327/543 |
| 5,063,304 A | * | 11/1991 | Iyengar ...................... | 327/310 |
| 5,321,653 A | * | 6/1994 | Suh et al. ............... | 365/189.09 |
| 5,384,741 A | | 1/1995 | Haraguchi et al. .......... | 365/201 |
| 5,420,798 A | | 5/1995 | Lin et al. .................... | 364/483 |
| 5,677,643 A | * | 10/1997 | Tomita ........................ | 327/78 |
| 5,754,418 A | | 5/1998 | Park et al. .................... | 363/60 |
| 5,841,725 A | | 11/1998 | Kang et al. ................. | 365/226 |
| 6,008,674 A | * | 12/1999 | Wada et al. .................... | 327/89 |
| 6,163,175 A | * | 12/2000 | Sharpe-Geisler ............. | 327/77 |
| 6,172,932 B1 | * | 1/2001 | Kim ........................... | 365/227 |
| 6,205,072 B1 | | 3/2001 | Jung .......................... | 365/207 |

FOREIGN PATENT DOCUMENTS

| | | | |
|---|---|---|---|
| GB | 2308453 | 6/1997 | |
| JP | 03-130998 | 6/1991 | ........... G11C/16/06 |
| JP | 04-289476 | 10/1992 | ........... G01R/31/28 |
| JP | 06-096593 | 4/1994 | ........... G11C/16/06 |
| JP | 08-129886 | 5/1996 | ......... G11C/11/408 |
| WO | WO 95/09483 | 4/1995 | |

OTHER PUBLICATIONS

U.K. Search Report dated Jul. 25, 2002.

* cited by examiner

Primary Examiner—Kamand Cuneo
Assistant Examiner—Tung X. Nguyen
(74) Attorney, Agent, or Firm—Marshall, Gerstein & Borun LLP

(57) ABSTRACT

A high voltage detector used in an integrated circuit having a high voltage generator for generating high voltage boosting internal voltage is disclosed. The high voltage detector may include a reference voltage supply for supplying reference voltage and a low voltage detector for comparing the reference voltage and the internal voltage and generating a low voltage detecting signal, which is enabled when the internal voltage level is less than a predetermined voltage level. The high voltage detector may also include a control signal outputting unit, which is configured as a current mirror and the high voltage and the internal voltage are applied, for controlling current flowing through the current mirror in response to the low voltage detecting signal and outputting a pumping control signal having a first or a second potential level.

29 Claims, 2 Drawing Sheets

HIGH VOLTAGE DETECTOR

TECHNICAL FIELD

A high voltage detector is disclosed, which can be normally operated even if power supply voltage applied to an integrated circuit requiring high voltage is decreased.

DESCRIPTION OF RELATED ART

Generally, a high voltage Vpp represents a pumped voltage, which is higher than an internal voltage driving an integrated circuit. High voltage detectors capable of detecting if the high voltage Vpp has decreased below a predetermined voltage level are commonly used in semiconductor devices.

A cell in a dynamic random access memory (DRAM) includes an NMOS transistor and a capacitor. When voltage is applied to the wordlines of the DRAM, voltage is lost due to the NMOS transistor. Accordingly, a high voltage Vpp is used as a voltage signal applied to wordlines of the cell in the DRAM. In particular, the high voltage Vpp level should be higher than the power supply voltage level.

FIG. 1 is a circuit diagram showing a high voltage detecting circuit according to the prior art. The high voltage detection circuit, which is configured to be a current mirror, includes a high voltage detecting unit 10 and a signal output unit 20. The high voltage detecting unit 10 compares the high voltage Vpp with a core voltage CVdd of a memory and generates an output signal of a predetermined potential level. The signal output unit 20 receives the output signal from the high voltage detecting unit 10 and outputs a signal of a logic 'high' or 'low' level.

The high voltage is applied to a source of a first PMOS T1 and the core voltage of the memory is applied to a source of a second PMOS transistor T2. Because the high voltage detecting unit 10 is configured to be a current mirror, a current flowing through the first PMOS transistor T1 and a first NMOS transistor T3 is identical to a current flowing through the second PMOS transistor T2 and a second NMOS transistor T4.

If the high voltage Vpp is decreased, the current flowing through the first PMOS transistor T1 and the first NMOS transistor T3 decreases and the current flowing the second PMOS transistor T2 and the second NMOS transistor T4 is likewise decreased. Because gates of the first and second PMOS transistors T1 and T2 are connected to a ground voltage level, resistance between the source and the drain is very low so that a potential level of the drain of the first NMOS transistor T3 is increased. When the potential level of the drain of the first NMOS transistor T3 is increased to a predetermined level, a first inverter 21 in the signal output unit 20 recognizes the increased potential level as a logic 'high' level so that the first inverter 21 outputs a signal of a logic 'low' level and the signal outputted from the first inverter 21 is inverted to a signal of logic 'high' level by a second inverter to create a pumping signal Vppen.

Because the high voltage detecting circuit using the current mirror compares the high voltage Vpp with the core voltage CVdd of the memory, when power supply voltage level is decreased, the high voltage detecting circuit can not detect whether the high voltage Vpp and the core voltage CVdd of the memory are simultaneously decreased. For example, when the power supply voltage is decreased from 3.3V to 2.5V, because the high voltage Vpp and the core voltage CVdd of the memory are simultaneously decreased at a uniform rate, the pumping signal Vppen, which is used for pumping the high voltage Vpp, is not enabled. Accordingly, there is a problem because the conventional high voltage detecting circuit cannot properly operate when the power supply voltage is changed.

SUMMARY

The disclosed apparatus may be a high voltage detector used in an integrated circuit having a high voltage generator for generating high voltage boosting internal voltage. Such an apparatus may include a reference voltage supplying unit for supplying reference voltage and a low voltage detecting unit for comparing the reference voltage and the internal voltage and generating a low voltage detecting signal, which is enabled when the internal voltage level is less than a predetermined voltage level. The apparatus may further include a control signal outputting unit, which is configured as a current mirror and to which the high voltage and the internal voltage are applied, for controlling current flowing through the current mirror in response to the low voltage detecting signal and outputting a pumping control signal having a first or a second potential level.

DETAILED DESCRIPTION

Hereinafter, a high voltage detector according to the present invention will be described in detail referring to the accompanying drawings.

Figure 1:
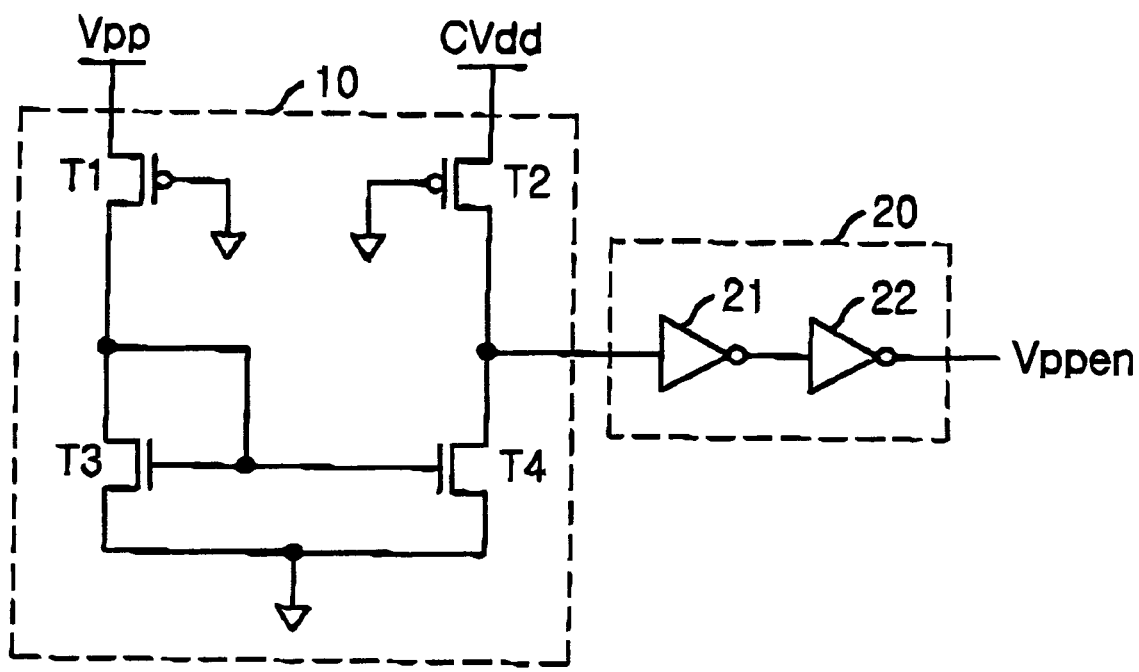
FIG. 1 is a circuit diagram illustrating a high voltage detector according to the prior art.
Figure 2:
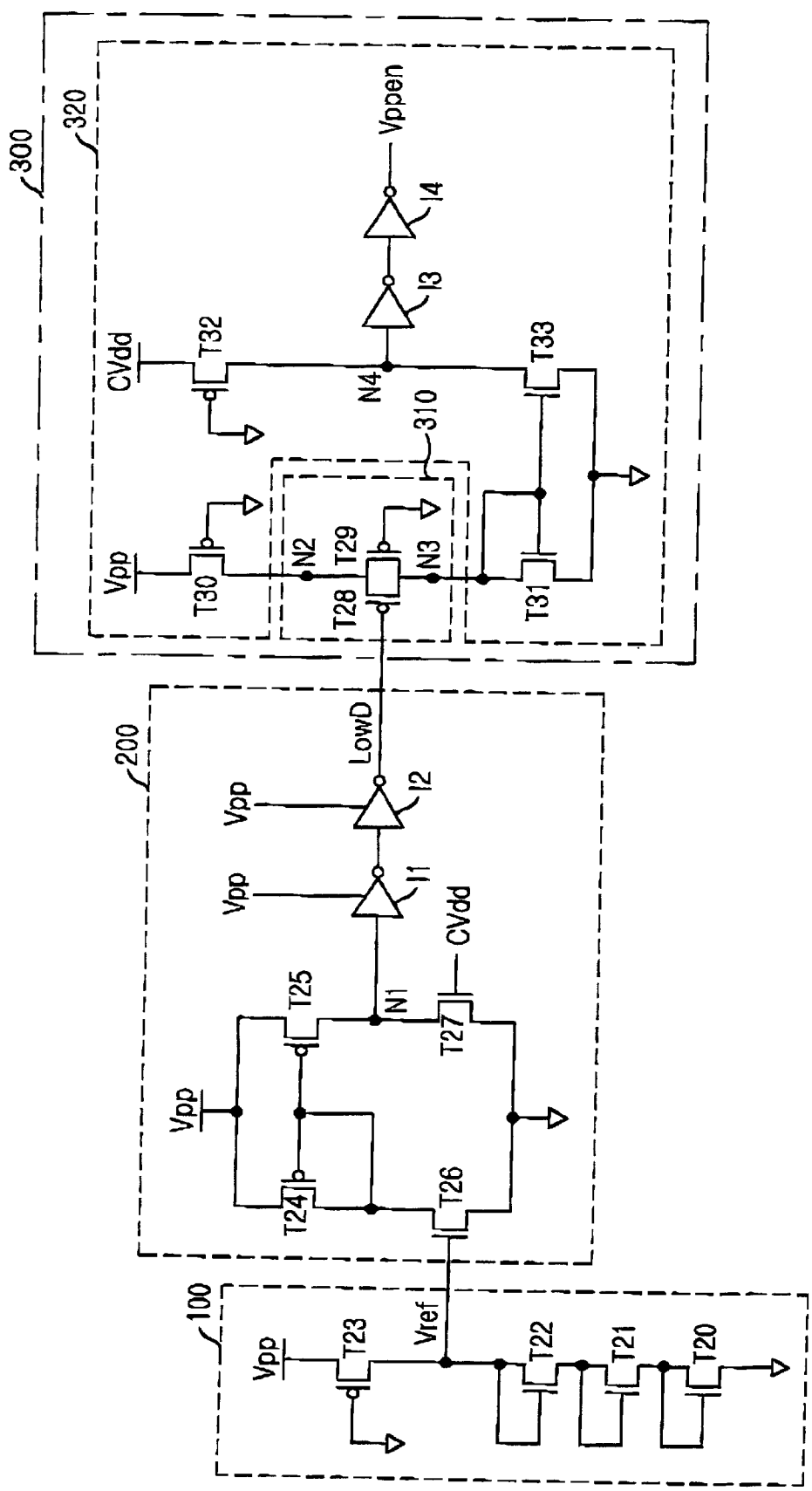
FIG. 2 is a circuit diagram illustrating the disclosed high voltage detector.

Referring to FIG. 2, when the high voltage Vpp is less than a predetermined voltage level in an integrated circuit having a high voltage generator (not shown) for boosting internal voltage CVdd, the high voltage Vpp is increased. The high voltage detector, which generates a pumping control signal Vppen to increase the high voltage Vpp, includes a reference voltage supplying unit 100, a low voltage detecting unit 200 and a control signal outputting unit 300.

In general, the reference voltage supplying unit 100 supplies a reference voltage Vref to the low voltage detecting unit 200. The low voltage detecting unit 200 generates a low voltage detecting signal LowD when the internal voltage CVdd is less than a predetermined voltage threshold, which is determined by comparing the reference voltage Vref with the internal voltage CVdd. The control signal outputting unit 300, which is configured as a current mirror using the high voltage Vpp and the internal voltage CVdd, controls a current flowing through the current mirror in response to the low voltage detecting signal LowD and outputs a pumping control signal Vppen having a logic 'high' or 'low' level.

More particularly, the reference voltage supplying unit 100 includes a PMOS transistor T23, having the high voltage Vpp applied to it source. The gate of the PMOS transistor T23 is connected to a ground voltage level. The reference voltage supplying unit 100 also includes NMOS transistors T20, T21 and T22, which are connected in series with a diode (not shown) connected between the first PMOS transistor T23 and the ground voltage level.

The low voltage detecting unit 200 includes PMOS transistors T24 and T25, to which the high voltage Vpp is applied. The gates of the PMOS transistors T24 and T25 are connected to a drain of the PMOS transistor T24. An NMOS transistor T26, which is connected between the PMOS transistor T24 and the ground voltage level, receives an input to its gate from the Vref voltage of the reference voltage supplying unit 100. An NMOS transistor T27, which is connected to the PMOS transistor T25 and the ground voltage level, has the internal voltage CVdd is applied to its gate thereof. A series combination of a first inverter I1 and a second inverter I2 is connected to the NMOS transistor T27. Voltage of a first node N1, which is connected between the PMOS transistor T25 and the NMOS transistor 27, is applied to the first inverter I1 enabled by the high voltage Vpp. The first inverter I1, which is enabled by the high voltage Vpp, inverts the voltage from N1 and the second inverter I2, which is also enabled by the high voltage Vpp, inverts an output of the first inverter I1 and outputs the low voltage detecting signal LowD of a logic 'high' or 'low' level.

The control signal outputting unit 300 includes a pass gate unit 310 and an output voltage generating unit 320. The pass gate unit 310 includes two PMOS transistors T28 and T29. The low voltage detecting signal LowD is applied to a gate of one PMOS transistor and a gate of the PMOS transistor T29 is connected to a ground voltage level. A resistance between a second node N2 and a third node N3 is changed by the low voltage detecting signal LowD. The output voltage generating unit 320, having a current mirror circuit, outputs the pumping control signal of a logic 'high' or 'low' level according to the resistance of the pass gate 310.

The output voltage generating unit 320 includes a PMOS transistor T30 that is connected to the high voltage Vpp and to the second node N2 and the gate of which is connected to a ground voltage level. The output voltage generating unit 320 also includes an NMOS transistor T31 having its drain and gate connected to a third node N3 and its source connected to the ground voltage level. A PMOS transistor T32 is connected to the internal voltage CVdd and the gate of the PMOS transistor T32 is connected to the ground voltage level. An NMOS transistor T33 is connected to a fourth node N4 and the ground voltage level. The gate of the NMOS transistor T33 is coupled to the third node N3 together with the NMOS transistor T31. A third inverter I3 is coupled to the fourth node N4 and a fourth inverter I4 is coupled to the third inverter I3. The third inverter I3 inverts voltage of the fourth node N4 and the fourth inverter I4 inverts an output of the third inverter I3 to create the pumping control signal Vppen.

Hereinafter, an operation of the high voltage detector is described. Because the gate of the PMOS transistor T23, to which the high voltage is applied, is connected to the ground voltage level via a summation voltage of threshold voltages of the NMOS transistors T20, T21 and T22, the reference voltage Vref is applied to a gate of an NMOS transistor T26 by the diode-connected NMOS transistors T20, T21 and T22 in the reference voltage supplying unit 100.

Because the reference voltage Vref applied to the gate of the NMOS transistor T26 is determined by the threshold voltage of each NMOS transistor T20, T21 and T22, the reference voltage Vref is hardly affected by variation of the high voltage Vpp applied to a source of the PMOS transistor T23. The number of the NMOS transistors used to generate the reference voltage Vref may be adjusted according to power supply voltage.

The low voltage detecting unit 200 compares the reference voltage Vref with the internal voltage CVdd that operates internal circuits of the memory and outputs the low voltage detecting signal LowD of a logic 'high' or 'low' level.

When the high voltage Vpp and the internal voltage CVdd are maintained in a predetermined potential level, because the low voltage detecting unit 200 is configured as a current mirror, a current flowing between the PMOS transistor T24 and the NMOS transistor T26 is identical to a current flowing between the PMOS transistor T25 and the NMOS transistor T27.

When power supply voltage (not shown) is decreased, a potential level of the reference voltage Vref is hardly varied; however, when power supply voltage applied from an external circuit of a synchronous semiconductor memory device is decreased, the internal voltage CVdd driving the internal logic (not shown) of the synchronous semiconductor memory device also decreases.

Accordingly, a resistance of the NMOS transistor T27 increases and voltage applied to an input terminal of the first inverter I1 increases. When the increased voltage becomes more than a predetermined voltage level, the first inverter I1 outputs a signal of a logic 'low' level and the second inverter I2 outputs a signal of a logic 'high' level as the low voltage detecting signal LowD. The first and second inverters I1 and I2 operate in response to the high voltage Vpp to generate the low voltage detecting signal only when the high voltage Vpp is applied.

The control signal outputting unit 300 increases or decreases currents flowing through sources and drains of the PMOS transistors T30 and T32 and the NMOS transistors T31 and T33, which are in the output voltage generating unit 320 configured as a current mirror, in response to the low voltage detecting signal LowD and outputs the pumping control signal Vppen of a logic 'high' or 'low' level so that, when the power supply voltage is decreased, the high voltage Vpp is increased.

The PMOS transistor T28 is designed to have lower resistance than the PMOS transistor T29 when the synchronous semiconductor memory device is fabricated. When the low voltage detecting signal LowD of a logic 'low' level is applied to the pass gate unit 310, the current outputted from the PMOS transistor T30 mostly flows through the PMOS transistor T28.

When the low voltage detecting signal LowD of a logic 'low' level is applied, a current flowing through the NMOS transistor T31 in the output voltage generating unit 320 configured as a current mirror is identical to a current flowing the through the NMOS transistor T33. At this time, a signal of a logic 'low' level is applied to an input terminal of the third inverter I3.

As mentioned in the above, when the internal voltage CVdd is decreased because the power supply voltage applied to the synchronous semiconductor memory device is decreased, the low voltage detecting signal LowD is transited into a signal of a logic 'high' level so that the PMOS transistor T28 is turned off because the signal of a logic 'high' level is applied to a gate thereof and the PMOS transistor T29 is only enabled.

Because the PMOS transistor T29 has higher resistance than the PMOS transistor T28, the current flowing through the PMOS transistors T30 and T29 and the NMOS transistor T31 is decreased. Because the gate of the PMOS transistor T32 is connected to the ground voltage level, resistance between a source and a drain is very low; however, a resistance between source and drain of the NMOS transistor 33 configuring the current mirror with the NMOS transistor T31 decreases so that a current flowing through the NMOS transistor T33 is decreased.

Accordingly, a potential level of the input terminal of the third inverter I3 is increased and the third inverter I3 outputs the signal of a logic 'low' level when the potential level is increased more than a predetermined level and the fourth inverter I4 outputs the pumping control signal Vppen of a logic 'high' level. Even if the power supply voltage level used in the integrated circuit, such as a synchronous semiconductor memory device, using the high voltage Vpp, decreases to a level lower that a predetermined level, a uniform potential level is maintained.

The disclosed apparatus provides a high voltage detector, which is used in an integrated circuit having a high voltage generator for generating high voltage boosting internal voltage. The high voltage detector generates a pumping control signal to increase the high voltage when the high voltage is less than a predetermined voltage level.

Although certain apparatus constructed in accordance with the teachings of this disclosure have been described herein, the scope of coverage of this patent is not limited thereto. On the contrary, this patent covers all embodiments of the teachings of this disclosure fairly falling within the scope of the appended claims either literally or under the doctrine of equivalents.

What is claimed is:

1. A high voltage detector used in an integrated circuit having a high voltage generator for generating a boosted internal voltage, comprising:
   a reference voltage supplying unit for supplying a reference voltage;
   a low voltage detecting unit for comparing the reference voltage and an internal voltage and generating a low voltage detecting signal, which is enabled when the internal voltage is less than a predetermined voltage level; and
   a control signal outputting unit, which is configured as a current mirror and to which the high voltage and the internal voltage are applied, for controlling current flowing through the current mirror in response to the low voltage detecting signal and outputting a pumping control signal having a first or a second potential level;
   the control signal outputting unit comprises:
   a first node:
   a second node;
   a pass gate unit having a resistance and connected between the first and second nodes, wherein the resistance is varied between the first and second nodes in response to the low voltage detecting signal; and
   an output voltage generating unit, which is configured as a current mirror and to which the high voltage and the internal voltage are applied, for outputting the pumping control signal of the first or second potential level according to the resistance of the pass gate.

2. The high voltage detector as recited in claim 1, wherein the pass gate unit comprises:
   a first PMOS transistor, which is connected to the first and second nodes and to a gate of which the low voltage detecting signal is applied; and
   a second PMOS transistor, which is connected to the first PMOS transistor and a gate of which is connected to a ground voltage level.

3. The high voltage detector as recited in claim 2, wherein the output voltage generating unit comprises:
   a third PMOS transistor, which is connected to the high voltage and the first node and a gate of which is connected to a ground voltage level;
   a first NMOS transistor, which is connected to the second node and the ground voltage level and a gate of which is connected to second node;
   a fourth PMOS transistor, which is connected to the internal voltage and a gate of which is connected to the ground voltage level;
   a second NMOS transistor, which is connected to the fourth PMOS transistor and the ground voltage level and a gate of which is connected to the second node together with the first NMOS transistor;
   a first inverter for inverting voltage between the fourth PMOS transistor and the second NMOS transistor; and
   a second inverter for inverting an output of the first inverter.

4. The high voltage detector as recited in claim 1, wherein the output voltage generating unit comprises:
   a third PMOS transistor, which is connected to the high voltage and the first node and a gate of which is connected to a ground voltage level;
   a first NMOS transistor, which is connected to the second node and the ground voltage level and a gate of which is connected to second node;
   a fourth PMOS transistor, which is connected to the internal voltage and a gate of which is connected to the ground voltage level;
   a second NMOS transistor, which is connected to the fourth PMOS transistor and the ground voltage level and a gate of which is connected to the second node together with the first NMOS transistor;
   a first inverter for inverting voltage between the fourth PMOS transistor and the second NMOS transistor; and
   a second inverter for inverting an output of the first inverter.

5. The high voltage detector as recited in claim 4, wherein the reference voltage supplying unit comprises:
   a fifth PMOS transistor, which is connected to the high voltage and a gate of which is connected to a ground voltage level;
   at least one diode-connected NMOS transistor connected between the fifth PMOS transistor and the ground voltage level.

6. The high voltage detector as recited in claim 1, wherein the reference voltage supplying unit comprises:
   a fifth PMOS transistor, which is connected to the high voltage and a gate of which is connected to a ground voltage level;
   at least one diode-connected NMOS transistor connected between the fifth PMOS transistor and the ground voltage level.

7. The high voltage detector as recited in claim 6, wherein the low voltage detecting unit comprises:
   sixth and seventh PMOS transistors, which are connected to high voltage and the gates of which are connected each other;
   a third NMOS transistor, which is connected to the sixth PMOS transistor and to the gate of which the reference voltage is applied;
   a fourth NMOS transistor, which is connected to the seventh PMOS transistor and a ground voltage level and to the gate of which the internal voltage is applied;
   a third inverter, which is enabled in response to the high voltage, for inverting a voltage level between the seventh PMOS transistor and the fourth NMOS transistor; and a fourth inverter, which is enabled in response to the high voltage, for inverting an output of the third inverter and outputting the low voltage detecting signal of a first or a second potential level.

8. The high voltage detector as recited in claim 1, wherein the low voltage detecting unit comprises:
   sixth and seventh PMOS transistors, which are connected to high voltage and the gates of which are connected each other;
   a third NMOS transistor, which is connected to the sixth PMOS transistor and to the gate of which the reference voltage is applied;
   a fourth NMOS transistor, which is connected to the seventh PMOS transistor and a ground voltage level and to the gate of which the internal voltage is applied;
   a third inverter, which is enabled in response to the high voltage, for inverting a voltage level between the seventh PMOS transistor and the fourth NMOS transistor; and
   a fourth inverter, which is enabled in response to the high voltage, for inverting an output of the third inverter and outputting the low voltage detecting signal of a first or a second potential level.

9. A high voltage detector used in an integrated circuit having a high voltage generator for generating a boosted internal voltage, comprising:
   a reference voltage supplying unit for supplying a reference voltage;
   a low voltage detecting unit for comparing the reference voltage and an internal voltage and generating a low voltage detecting signal, which is enabled when the internal voltage is less than a predetermined voltage level; and
   a control signal outputting unit, which is configured as a current mirror and to which the high voltage and the internal voltage are applied, for controlling current flowing through the current mirror in response to the low voltage detecting signal and outputting a pumping control signal having a first or a second potential level;
   the pass gate unit comprises:
      a first PMOS transistor, which is connected to the first and second nodes and to a gate of which the low voltage detecting signal is applied; and
      a second PMOS transistor, which is connected to the first PMOS transistor and a gate of which is connected to a ground voltage level.

10. The high voltage detector as recited in claim 9, wherein the control signal outputting unit comprises:
   a first node;
   a second node;
   a pass gate unit having a resistance and connected between the first and second nodes, wherein the resistance is varied between the first and second nodes in response to the low voltage detecting signal; and
   an output voltage generating unit, which is configured as a current mirror and to which the high voltage and the internal voltage are applied, for outputting the pumping control signal of the first or second potential level according to the resistance of the pass gate.

11. The high voltage detector as recited in claim 9, wherein the output voltage generating unit comprises:
   a third PMOS transistor, which is connected to the high voltage and the first node and a gate of which is connected to a ground voltage level;
   a first NMOS transistor, which is connected to the second node and the ground voltage level and a gate of which is connected to second node;
   a fourth PMOS transistor, which is connected to the internal voltage and a gate of which is connected to the ground voltage level;
   a second NMOS transistor, which is connected to the fourth PMOS transistor and the ground voltage level and a gate of which is connected to the second node together with the first NMOS transistor;
   a first inverter for inverting voltage between the fourth PMOS transistor and the second NMOS transistor; and
   a second inverter for inverting an output of the first inverter.

12. The high voltage detector as recited in claim 11, wherein the reference voltage supplying unit comprises:
   a fifth PMOS transistor, which is connected to the high voltage and a gate of which is connected to a ground voltage level;
   at least one diode-connected NMOS transistor connected between the fifth PMOS transistor and the ground voltage level.

13. The high voltage detector as recited in claim 12, wherein the low voltage detecting unit comprises:
   sixth and seventh PMOS transistors, which are connected to high voltage and the gates of which are connected each other;
   a third NMOS transistor, which is connected to the sixth PMOS transistor and to the gate of which the reference voltage is applied;
   a fourth NMOS transistor, which is connected to the seventh PMOS transistor and a ground voltage level and to the gate of which the internal voltage is applied;
   a third inverter, which is enabled in response to the high voltage, for inverting a voltage level between the seventh PMOS transistor and the fourth NMOS transistor; and
   a fourth inverter, which is enabled in response to the high voltage, for inverting an output of the third inverter and outputting the low voltage detecting signal of a first or a second potential level.

14. The high voltage detector as recited in claim 9, wherein the reference voltage supplying unit comprises:
   a fifth PMOS transistor, which is connected to the high voltage and a gate of which is connected to a ground voltage level;
   at least one diode-connected NMOS transistor connected between the fifth PMOS transistor and the ground voltage level.

15. The high voltage detector as recited in claim 9, wherein the low voltage detecting unit comprises:
   sixth and seventh PMOS transistors, which are connected to high voltage and the gates of which are connected each other;
   a third NMOS transistor, which is connected to the sixth PMOS transistor and to the gate of which the reference voltage is applied;
   a fourth NMOS transistor, which is connected to the seventh PMOS transistor and a ground voltage level and to the gate of which the internal voltage is applied;
   a third inverter, which is enabled in response to the high voltage, for inverting a voltage level between the seventh PMOS transistor and the fourth NMOS transistor; and
   a fourth inverter, which is enabled in response to the high voltage, for inverting an output of the third inverter and outputting the low voltage detecting signal of a first or a second potential level.

16. A high voltage detector used in an integrated circuit having a high voltage generator for generating a boosted internal voltage, comprising:
- a reference voltage supplying unit for supplying a reference voltage;
- a low voltage detecting unit for comparing the reference voltage and an internal voltage and generating a low voltage detecting signal, which is enabled when the internal voltage is less than a predetermined voltage level; and
- a control signal outputting unit, which is configured as a current mirror and to which the high voltage and the internal voltage are applied, for controlling current flowing through the current mirror in response to the low voltage detecting signal and outputting a pumping control signal having a first or a second potential level; the output voltage generating unit comprises:
  - a third PMOS transistor, which is connected to the high voltage and the first node and a gate of which is connected to a ground voltage level;
  - a first NMOS transistor, which is connected to the second node and the ground voltage level and a gate of which is connected to second node;
  - a fourth PMOS transistor, which is connected to the internal voltage and a gate of which is connected to the ground voltage level;
  - a second NMOS transistor, which is connected to the fourth PMOS transistor and the ground voltage level and a gate of which is connected to the second node together with the first NMOS transistor;
  - a first inverter for inverting voltage between the fourth PMOS transistor and the second NMOS transistor; and
  - a second inverter for inverting an output of the first inverter.

17. The high voltage detector as recited in claim 16, wherein the control signal outputting unit comprises:
- a first node;
- a second node;
- a pass gate unit having a resistance and connected between the first and second nodes, wherein the resistance is varied between the first and second nodes in response to the low voltage detecting signal; and
- an output voltage generating unit, which is configured as a current mirror and to which the high voltage and the internal voltage are applied, for outputting the pumping control signal of the first or second potential level according to the resistance of the pass gate.

18. The high voltage detector as recited in claim 17, wherein the pass gate unit comprises:
- a first PMOS transistor, which is connected to the first and second nodes and to a gate of which the low voltage detecting signal is applied; and
- a second PMOS transistor, which is connected to the first PMOS transistor and a gate of which is connected to a ground voltage level.

19. The high voltage detector as recited in claim 18, wherein the reference voltage supplying unit comprises:
- a fifth PMOS transistor, which is connected to the high voltage and a gate of which is connected to a ground voltage level;
- at least one diode-connected NMOS transistor connected between the fifth PMOS transistor and the ground voltage level.

20. The high voltage detector as recited in claim 19, wherein the low voltage detecting unit comprises:
- sixth and seventh PMOS transistors, which are connected to high voltage and the gates of which are connected each other;
- a third NMOS transistor, which is connected to the sixth PMOS transistor and to the gate of which the reference voltage is applied;
- a fourth NMOS transistor, which is connected to the seventh PMOS transistor and a ground voltage level and to the gate of which the internal voltage is applied;
- a third inverter, which is enabled in response to the high voltage, for inverting a voltage level between the seventh PMOS transistor and the fourth NMOS transistor; and
- a fourth inverter, which is enabled in response to the high voltage, for inverting an output of the third inverter and outputting the low voltage detecting signal of a first or a second potential level.

21. The high voltage detector as recited in claim 16, wherein the reference voltage supplying unit comprises:
- a fifth PMOS transistor, which is connected to the high voltage and a gate of which is connected to a ground voltage level;
- at least one diode-connected NMOS transistor connected between the fifth PMOS transistor and the ground voltage level.

22. The high voltage detector as recited in claim 16, wherein the low voltage detecting unit comprises:
- sixth and seventh PMOS transistors, which are connected to high voltage and the gates of which are connected each other;
- a third NMOS transistor, which is connected to the sixth PMOS transistor and to the gate of which the reference voltage is applied;
- a fourth NMOS transistor, which is connected to the seventh PMOS transistor and a ground voltage level and to the gate of which the internal voltage is applied;
- a third inverter, which is enabled in response to the high voltage, for inverting a voltage level between the seventh PMOS transistor and the fourth NMOS transistor; and
- a fourth inverter, which is enabled in response to the high voltage, for inverting an output of the third inverter and outputting the low voltage detecting signal of a first or a second potential level.

23. A high voltage detector used in an integrated circuit having a high voltage generator for generating a boosted internal voltage, comprising:
- a reference voltage supplying unit for supplying a reference voltage;
- a low voltage detecting unit for comparing the reference voltage and an internal voltage and generating a low voltage detecting signal, which is enabled when the internal voltage is less than a predetermined voltage level; and
- a control signal outputting unit, which is configured as a current mirror and to which the high voltage and the internal voltage are applied, for controlling current flowing through the current mirror in response to the low voltage detecting signal and outputting a pumping control signal having a first or a second potential level; the low voltage detecting unit comprises:
  - sixth and seventh PMOS transistors, which are connected to high voltage and the gates of which are connected each other;
  - a third NMOS transistor, which is connected to the sixth PMOS transistor and to the gate of which the reference voltage is applied;
  - a fourth NMOS transistor, which is connected to the seventh PMOS transistor and a ground voltage level and to the gate of which the internal voltage is applied;

a third inverter, which is enabled in response to the high voltage, for inverting a voltage level between the seventh PMOS transistor and the fourth NMOS transistor; and a fourth inverter, which is enabled in response to the high voltage, for inverting an output of the third inverter and outputting the low voltage detecting signal of a first or a second potential level.

24. The high voltage detector as recited in claim 23, wherein the control signal outputting unit comprises:

a first node;

a second node;

a pass gate unit having a resistance and connected between the first and second nodes, wherein the resistance is varied between the first and second nodes in response to the low voltage detecting signal; and an output voltage generating unit, which is configured as a current mirror and to which the high voltage and the internal voltage are applied, for outputting the pumping control signal of the first or second potential level according to the resistance of the pass gate.

25. The high voltage detector as recited in claim 23, wherein the pass gate unit comprises:

a first PMOS transistor, which is connected to the first and second nodes and to a gate of which the low voltage detecting signal is applied; and a second PMOS transistor, which is connected to the first PMOS transistor and a gate of which is connected to a ground voltage level.

26. The high voltage detector as recited in claim 25, wherein the output voltage generating unit comprises:

a third PMOS transistor, which is connected to the high voltage and the first node and a gate of which is connected to a ground voltage level;

a first NMOS transistor, which is connected to the second node and the ground voltage level and a gate of which is connected to second node;

a fourth PMOS transistor, which is connected to the internal voltage and a gate of which is connected to the ground voltage level;

a second NMOS transistor, which is connected to the fourth PMOS transistor and the ground voltage level and a gate of which is connected to the second node together with the first NMOS transistor;

a first inverter for inverting voltage between the fourth PMOS transistor and the second NMOS transistor; and a second inverter for inverting an output of the first inverter.

27. The high voltage detector as recited in claim 26, wherein the reference voltage supplying unit comprises:

a fifth PMOS transistor, which is connected to the high voltage and a gate of which is connected to a ground voltage level;

at least one diode-connected NMOS transistor connected between the fifth PMOS transistor and the ground voltage level.

28. The high voltage detector as recited in claim 23, wherein the output voltage generating unit comprises:

a third PMOS transistor, which is connected to the high voltage and the first node and a gate of which is connected to a ground voltage level;

a first NMOS transistor, which is connected to the second node and the ground voltage level and a gate of which is connected to second node;

a fourth PMOS transistor, which is connected to the internal voltage and a gate of which is connected to the ground voltage level;

a second NMOS transistor, which is connected to the fourth PMOS transistor and the ground voltage level and a gate of which is connected to the second node together with the first NMOS transistor;

a first inverter for inverting voltage between the fourth PMOS transistor and the second NMOS transistor; and a second inverter for inverting an output of the first inverter.

29. The high voltage detector as recited in claim 23, wherein the reference voltage supplying unit comprises:

a fifth PMOS transistor, which is connected to the high voltage and a gate of which is connected to a ground voltage level;

at least one diode-connected NMOS transistor connected between the fifth PMOS transistor and the ground voltage level.

* * * * *

UNITED STATES PATENT AND TRADEMARK OFFICE
CERTIFICATE OF CORRECTION

PATENT NO. : 6,661,218 B2
DATED : December 9, 2003
INVENTOR(S) : Yong-Ki Kim

It is certified that error appears in the above-identified patent and that said Letters Patent is hereby corrected as shown below:

Column 5,
Line 63, please delete "claim 2," and replace with -- claim 1, --.

Signed and Sealed this

Twenty-fifth Day of May, 2004

JON W. DUDAS
*Acting Director of the United States Patent and Trademark Office*